US012641878B2

(12) United States Patent
Zhang et al.

(10) Patent No.: US 12,641,878 B2
(45) Date of Patent: May 26, 2026

(54) STACKED TRANSISTOR WITH NON-ACTIVE REGION

(71) Applicant: International Business Machines Corporation, Armonk, NY (US)

(72) Inventors: Chen Zhang, Santa Clara, CA (US); Ruilong Xie, Niskayuna, NY (US); Min Gyu Sung, Latham, NY (US); Shay Reboh, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 18/530,681

(22) Filed: Dec. 6, 2023

(65) Prior Publication Data

US 2025/0194241 A1 Jun. 12, 2025

(51) Int. Cl.
| | |
|---|---|
| *H10D 84/85* | (2025.01) |
| *H10B 10/00* | (2023.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 88/00* | (2026.01) |

(52) U.S. Cl.
CPC ......... *H10D 84/856* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0186* (2025.01); *H10D 84/038* (2025.01); *H10D 88/01* (2025.01); *H10B 10/125* (2023.02)

(58) Field of Classification Search
None
See application file for complete search history.

(56) References Cited

U.S. PATENT DOCUMENTS

| | | | |
|---|---|---|---|
| 11,367,796 B2 | 6/2022 | Guha et al. | |
| 11,545,574 B2 | 1/2023 | Wang et al. | |
| 11,688,742 B2 | 6/2023 | Hong et al. | |
| 2022/0310787 A1* | 9/2022 | Ye ....................... | H10D 30/024 |
| 2022/0359506 A1 | 11/2022 | Ng et al. | |
| 2022/0399335 A1 | 12/2022 | Guler et al. | |

FOREIGN PATENT DOCUMENTS

WO 2022173630 A1 8/2022

OTHER PUBLICATIONS

D. Wang et al., "Investigation of Source/Drain Recess Engineering and Its Impacts on FinFET and GAA Nanosheet FET at 5 nm Node," Electronics, Feb. 3, 2023, 13 pages, vol. 12, No. 770.

* cited by examiner

*Primary Examiner* — Bo B Jang
(74) *Attorney, Agent, or Firm* — Kristofer Haggerty; Ryan, Mason & Lewis, LLP

(57) ABSTRACT

A semiconductor structure includes a transistor device having a first nanosheet device disposed on a second nanosheet device in a stacked configuration. The first nanosheet device includes a plurality of first nanosheet channel layers, wherein each of the plurality of first nanosheet channel layers have a nanosheet channel portion on one end and a dielectric material portion on another end. The second nanosheet device includes a plurality of second nanosheet channel layers. The dielectric material portion of the plurality of first nanosheet channel layers is part of a non-active region.

20 Claims, 10 Drawing Sheets

STACKED TRANSISTOR WITH NON-ACTIVE REGION

BACKGROUND

Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Illustrative embodiments of the present application include techniques for use in semiconductor manufacture.

In an illustrative embodiment, a semiconductor structure comprises a transistor device comprising a first nanosheet device disposed on a second nanosheet device in a stacked configuration, the first nanosheet device comprises a plurality of first nanosheet channel layers, wherein each of the plurality of first nanosheet channel layers comprise a nanosheet channel portion on one end and a dielectric material portion on another end, and the second nanosheet device comprises a plurality of second nanosheet channel layers. The dielectric material portion of the plurality of first nanosheet channel layers is part of a non-active region.

The semiconductor structure of the illustrative embodiment advantageously allows for a stacked nanosheet field-effect transistor device with a non-active region in a top nanosheet field-effect transistor having channel edges that are disposed under the gate structure.

In one or more additional illustrative embodiments, as may be combined with the preceding paragraphs, the semiconductor structure further comprises a gate region disposed between the plurality of first nanosheet channel layers and the plurality of second nanosheet channel layers.

In one or more additional illustrative embodiments, as may be combined with the preceding paragraphs, the semiconductor structure further comprises a dielectric fill disposed on sidewalls of the first nanosheet device associated with the dielectric material portion.

In one or more additional illustrative embodiments, as may be combined with the preceding paragraphs, the first nanosheet device and the second nanosheet device are separated by a middle dielectric insulator layer.

In one or more additional illustrative embodiments, as may be combined with the preceding paragraphs, the nanosheet channel portion of the plurality of first nanosheet channel layers and the second nanosheet channel layers each comprise silicon.

In one or more additional illustrative embodiments, as may be combined with the preceding paragraphs, the first nanosheet device and the second nanosheet device have opposite polarities.

In one or more additional illustrative embodiments, as may be combined with the preceding paragraphs, the first nanosheet device is one of a p-type nanosheet field-effect transistor device or an n-type nanosheet field-effect transistor device and the second nanosheet device is one of a p-type nanosheet field-effect transistor device or an n-type nanosheet field-effect transistor device.

In one or more additional illustrative embodiments, as may be combined with the preceding paragraphs, the semiconductor structure further comprises a first source/drain region disposed on a first sidewall of the first nanosheet device associated with the nanosheet channel portion of the plurality of first nanosheet channel layers, and a dielectric fill disposed on a second sidewall of the first nanosheet device associated with the dielectric material portion of the plurality of first nanosheet channel layers.

In one or more additional illustrative embodiments, as may be combined with the preceding paragraphs, the semiconductor structure further comprises a second source/drain region disposed on a first sidewall of the plurality of second nanosheet channel layers of the second nanosheet device and a third source/drain region disposed on a second sidewall of the plurality of second nanosheet channel layers of the second nanosheet device.

In one or more additional illustrative embodiments, as may be combined with the preceding paragraphs, the first sidewall of the first nanosheet device, the first sidewall of the plurality of second nanosheet channel layers and the second sidewall of the plurality of second nanosheet channel layers are each part of an active region.

In another illustrative embodiment, a semiconductor structure comprises a first transistor device comprising a first nanosheet device disposed on a second nanosheet device in a stacked configuration. The first nanosheet device comprises a plurality of first nanosheet channel layers, wherein each of the plurality of first nanosheet channel layers comprise a first nanosheet channel portion on one end and a first dielectric material portion on another end, and the second nanosheet device comprising a plurality of second nanosheet channel layers. The semiconductor structure further comprises a second transistor device adjacent the first transistor device and comprising a third nanosheet device disposed on a fourth nanosheet device in a stacked configuration. The third nanosheet device comprising a plurality of third nanosheet channel layers, wherein each of the plurality of third nanosheet channel layers comprise a second nanosheet channel portion on one end and a second dielectric material portion on another end, and the fourth nanosheet device comprising a plurality of fourth nanosheet channel layers. The semiconductor structure further comprises a dielectric fill disposed on adjacent sidewalls associated with the first dielectric material portion of the plurality of first nanosheet channel layers and the second dielectric material portion of the plurality of third nanosheet channel layers between the first nanosheet device and the third nanosheet device.

The semiconductor structure of the illustrative embodiment advantageously allows for a stacked nanosheet field-effect transistor device with a non-active region in a top nanosheet field-effect transistor having channel edges that are disposed under the gate structure.

In one or more additional illustrative embodiments, as may be combined with the preceding paragraphs, the first transistor device further comprising a first gate region disposed between the plurality of first nanosheet channel layers and the plurality of second nanosheet channel layers, and wherein the second transistor device further comprising a second gate region disposed between the plurality of third nanosheet channel layers and the plurality of fourth nanosheet channel layers.

In one or more additional illustrative embodiments, as may be combined with the preceding paragraphs, the semiconductor structure further comprises a first source/drain region disposed on another sidewall of the first nanosheet device associated with the first nanosheet channel portion of the plurality of first nanosheet channel layers, and a second source/drain region disposed on another sidewall of the third nanosheet device associated with the second nanosheet channel portion of the plurality of third nanosheet channel layers.

In one or more additional illustrative embodiments, as may be combined with the preceding paragraphs, the semiconductor structure further comprises a third source/drain region disposed on adjacent sidewalls of the plurality of second nanosheet channel layers and the plurality of fourth nanosheet channel layers.

In one or more additional illustrative embodiments, as may be combined with the preceding paragraphs, the first nanosheet channel portion, the second nanosheet channel portion, the second nanosheet channel layers and the fourth nanosheet channel layers each comprise silicon.

In one or more additional illustrative embodiments, as may be combined with the preceding paragraphs, the first nanosheet device and the fourth nanosheet device have a first polarity, and the second nanosheet device and the fourth nanosheet device have a second polarity different than the first polarity.

In one or more additional illustrative embodiments, as may be combined with the preceding paragraphs, the first polarity is an n-type polarity or a p-type polarity and the second polarity is a p-type polarity or an n-type polarity.

In yet another illustrative embodiment, a semiconductor structure comprises a transistor device comprising a first nanosheet device disposed on a second nanosheet device in a stacked configuration. The first nanosheet device comprises a plurality of first nanosheet channel layers, wherein each of the plurality of first nanosheet channel layers comprise a nanosheet channel portion on one end and a dielectric fill portion on another end. The second nanosheet device comprising a plurality of second nanosheet channel layers. The dielectric fill portion of the plurality of first nanosheet channel layers is part of a non-active region.

The semiconductor structure of the illustrative embodiment advantageously allows for a stacked nanosheet field-effect transistor device with a non-active region in a top nanosheet field-effect transistor having channel edges that are disposed under the gate structure.

In one or more additional illustrative embodiments, as may be combined with the preceding paragraphs, the dielectric fill portion is further disposed between the plurality of first nanosheet channel layers and on sidewalls of the first nanosheet device associated with the dielectric fill portion.

In one or more additional illustrative embodiments, as may be combined with the preceding paragraphs, the semiconductor structure further comprises a first source/drain region disposed on a sidewall of the first nanosheet device associated with the nanosheet channel portion of the plurality of first nanosheet channel layers, a second source/drain region disposed on a first sidewall of the plurality of second nanosheet channel layers of the second nanosheet device, a third source/drain region disposed on a second sidewall of the plurality of second nanosheet channel layers of the second nanosheet device, and a gate region disposed within the plurality of second nanosheet channel layers of the second nanosheet device.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1:
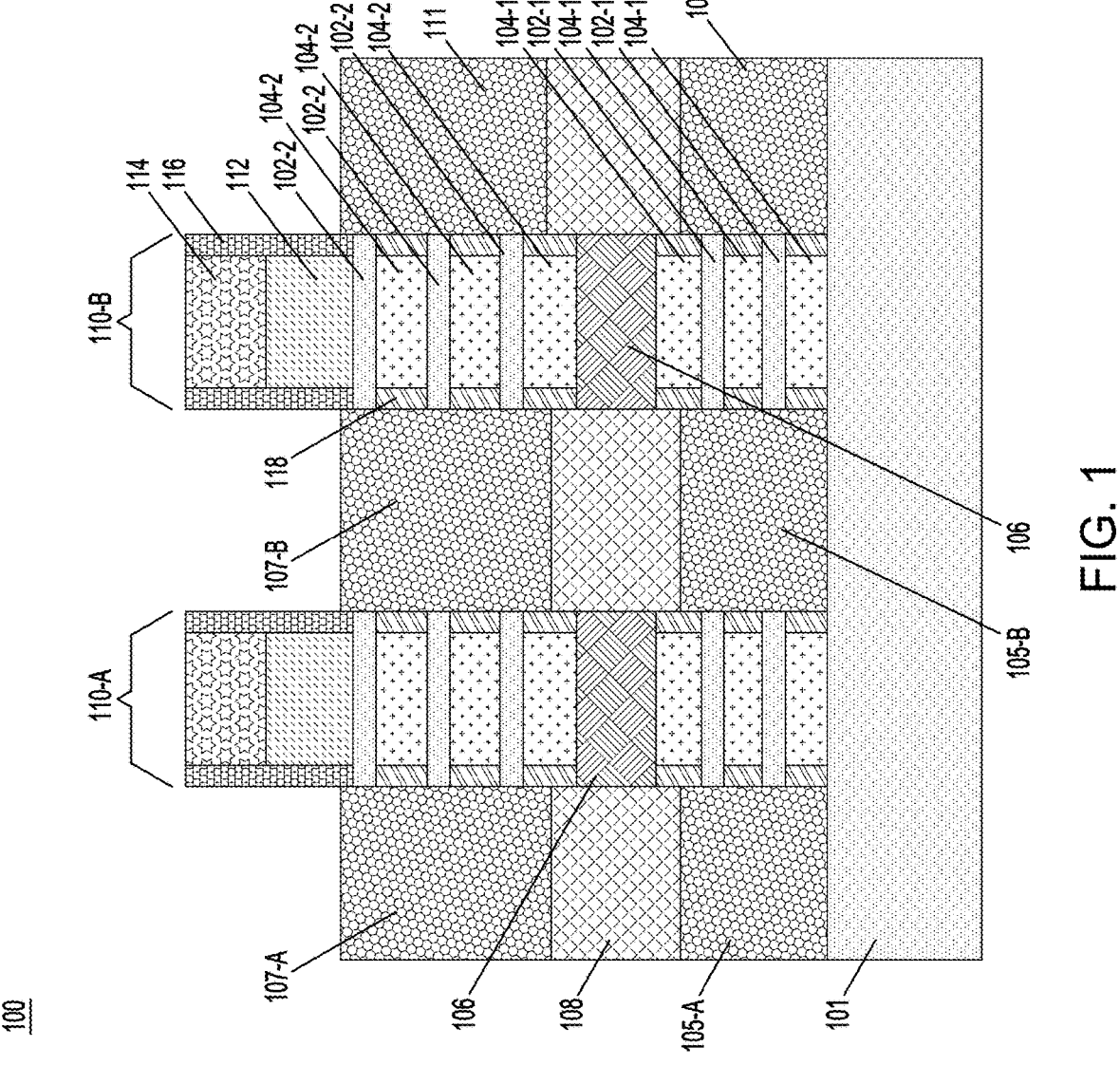
FIG. 1 is a cross-sectional view of a semiconductor structure at a first-intermediate fabrication stage, according to an illustrative embodiment.

Illustrative embodiments of the invention may be described herein in the context of semiconductor technology fabrication, and more particularly to a semiconductor structure including a stacked nanosheet field-effect transistor device with a static random-access memory (SRAM) design, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof are to be broadly construed to relate to the disclosed structures and methods, as oriented in the drawings, wherein such structures may be understood to have the same configuration (e.g., layers stacked in the same order) even if the structure is rotated to a different angle from that shown in the drawings.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The patterns created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

SRAM is a type of random-access memory (RAM) that uses latch circuitry (flip-flop) to store each bit. A typical SRAM cell is made up of six FETs. Each bit in a conventional SRAM is stored on four of the transistors that form two cross-coupled inverters. This storage cell has two stable states which are used to denote 0 and 1. Two additional access transistors serve to control the access to a storage cell during read and write operations. In addition to such six-transistor (6T) SRAM, other kinds of SRAM chips use 4, 8, 10 (4T, 8T, 10T SRAM), or more transistors per bit. However, providing a SRAM design in a stacked architecture is a challenge.

In a stacked nanosheet field-effect transistor device SRAM, there is a need to cut the non-active area differently from the active area such that the cut edge of the non-active region is disposed (i.e., tucked) under the gate structure. However, since the gate structure has becoming extremely narrow in the design of a relevant pitch, the precise location in cutting the non-active area (i.e., the cut edge) of the non-active region is challenging.

The non-limiting illustrative embodiments of the present disclosure overcome the foregoing drawbacks. Referring now to the drawings in which like numerals represent the same or similar elements, FIGS. 1-10 illustrate various processes for fabricating semiconductor structures with non-active regions and active-regions. Note that the same reference numeral (100) is used to denote the semiconductor structure through the various intermediate fabrication stages illustrated in FIGS. 1-10. Note also that the semiconductor structures described herein can also be considered to be a semiconductor device and/or an integrated circuit, or some part thereof. For the purpose of clarity, some fabrication steps leading up to the production of the semiconductor structures as illustrated in FIGS. 1-10 are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Referring now to FIG. 1-7, FIG. 1 shows a cross-sectional view of a semiconductor structure 100 with a substrate 101 in accordance with an illustrative embodiment. Substrate 101 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 101 is silicon.

Nanosheet stacks 110-A and 110-B (also referred to as nanosheet devices) are formed over the substrate 101, where the nanosheet stacks include nanosheet channel layers 102-1 and 102-2 (collectively, nanosheet channel layers 102) and sacrificial layers 104-1 and 104-2 (collectively, sacrificial layers 104).

Sacrificial layers 104 are illustratively formed of different sacrificial materials, such that they may be etched or otherwise removed selective to one another. In some embodiments, the sacrificial layers 104 are formed of silicon germanium (SiGe), but with different percentages of Ge. For example, the sacrificial layers 104-1 may have a relatively higher percentage of Ge (e.g., 55% Ge), and the sacrificial layers 104-2 may have a relatively lower percentage of Ge (e.g., 25% Ge). Other combinations of different sacrificial materials may be used in other embodiments.

Nanosheet channel layers 102 may be formed of silicon (Si) or another suitable material (e.g., a material similar to that used for the substrate 101).

Nanosheet stacks 110-A and 110-B further include a middle dielectric insulator (MDI) layer 106 separating nanosheet channel layers 102-1 and sacrificial layers 104-1 from nanosheet channel layers 102-2 and sacrificial layers 104-2. MDI layer 106 may be formed of any suitable insulator or dielectric material, such as SiN, silicon boron carbide nitride (SiBCN), silicon oxycarbonitride (SiOCN), etc.

Semiconductor structure 100 further shows dummy gate portions 112 over semiconductor structure 100, with gate hard mask (HM) layers 114. Dummy gate portions 112 may be formed by blanket deposition of a dummy gate material (e.g., amorphous silicon (a-Si) or amorphous silicon germanium (a-SiGe) over a thin $SiO_2$ or titanium nitride (TiN) layer, or another suitable material) and material of gate HM layers 114 (e.g., silicon nitride (SiN), a multi-layer of SiN and $SiO_2$, or another suitable material), followed by lithographic processing to result in the patterned gate HM layers 114 and underlying dummy gate portions 112.

Semiconductor structure 100 further shows outer spacers 116 and inner spacers 118. Outer spacers 116 and inner spacers 118 may be formed of silicon nitride (SiN) or another suitable material such as SiBCN, silicon carbide oxide (SiCO), SiOCN, etc.

Semiconductor structure 100 further shows a bottom source region 105-A (also referred to as a pull-down transistor source region), and a bottom drain region 105-B (also referred to as a pull-down transistor drain region), (collectively bottom source/drain regions 105 or pull-down transistor source/drain regions 105) disposed on substrate 101.

Semiconductor structure 100 further shows an interlayer dielectric (ILD) layer 108 disposed on bottom source/drain regions 105. ILD layer 108 may be formed of any suitable isolating material, such as $SiO_2$, SiOC, SiON, etc.

Semiconductor structure 100 further shows a top source region 107-A (also referred to as a pull-up transistor source region), and a top drain region 107-B (also referred to as a pull-up transistor drain region), (collectively top source/drain regions 107 or pull-up transistor source/drain regions 107) disposed on ILD layer 108.

Semiconductor structure 100 further shows a bottom epitaxial region 109 and a top epitaxial region 111.

Bottom source/drain regions 105, top source/drain regions 107, bottom epitaxial region 109 and top epitaxial region 111 may be formed using known epitaxial growth processes. Bottom source/drain regions 105, top source/drain regions 107, bottom epitaxial region 109 and top epitaxial region 111 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), MBE, liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$.

In some embodiments, the bottom source/drain regions 105 and bottom epitaxial region 109 may be a part of a p-type transistor (pFET). In some embodiments, the top source/drain regions 107 may be part of an n-type transistors (nFET).

In some embodiments, the bottom source/drain regions 105 and bottom epitaxial region 109 may be part of an nFET. In some embodiments, the top source/drain regions 107 and top epitaxial region 111 may be part of a pFET.

Figure 2:
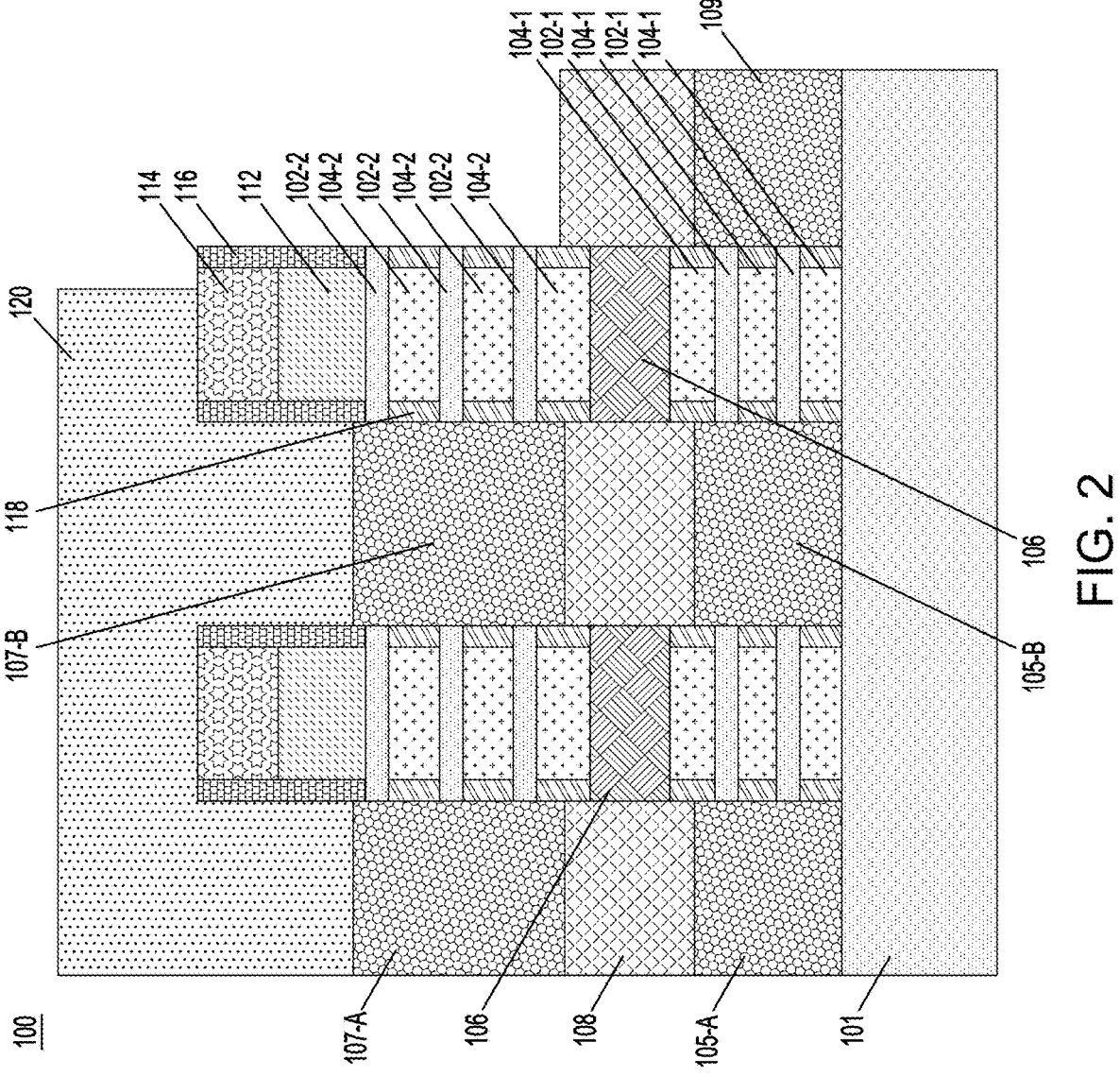
FIG. 2 is a cross-sectional view of the semiconductor structure for use at a second-intermediate fabrication stage, according to an illustrative embodiment.

FIG. 2 illustrates a cross-sectional view of semiconductor structure 100 following a standard lithography and etching process to remove top epitaxial region 111. For example, a mask layer 120 (e.g., an organic planarization layer (OPL) or a spin-on-carbon (SOC)) may be deposited on the semiconductor structure 100. In some embodiments, the OPL comprises an organic polymer including carbon (C), hydrogen (H), and nitrogen (N). In an embodiment, the OPL material can be free of silicon (Si). According to an embodiment, the OPL material can be free of Si and germanium (Ge). As defined herein, a material is free of an atomic element when the level of the atomic element in the material is at or below a trace level detectable with analytic methods available in the art. The mask layer 120 can be deposited, for example, by spin coating.

Next, mask layer 120 is patterned and subjected to standard lithographic and etching processes such as RIE to selectively remove a portion of mask layer 120 and top epitaxial region 111 to expose a sidewall of nanosheet channel layers 102-2, outer spacers 116 and inner spacers 118.

Following the lithography and selective removal of top epitaxial region 111, mask layer 120 is stripped. For example, mask layer 120 can be stripped using, for example, an ashing process or by oxygen plasma, nitrogen/hydrogen plasma or other carbon strip process. OPL stripping causes minimal or no damage to exposed layers.

Figure 3:
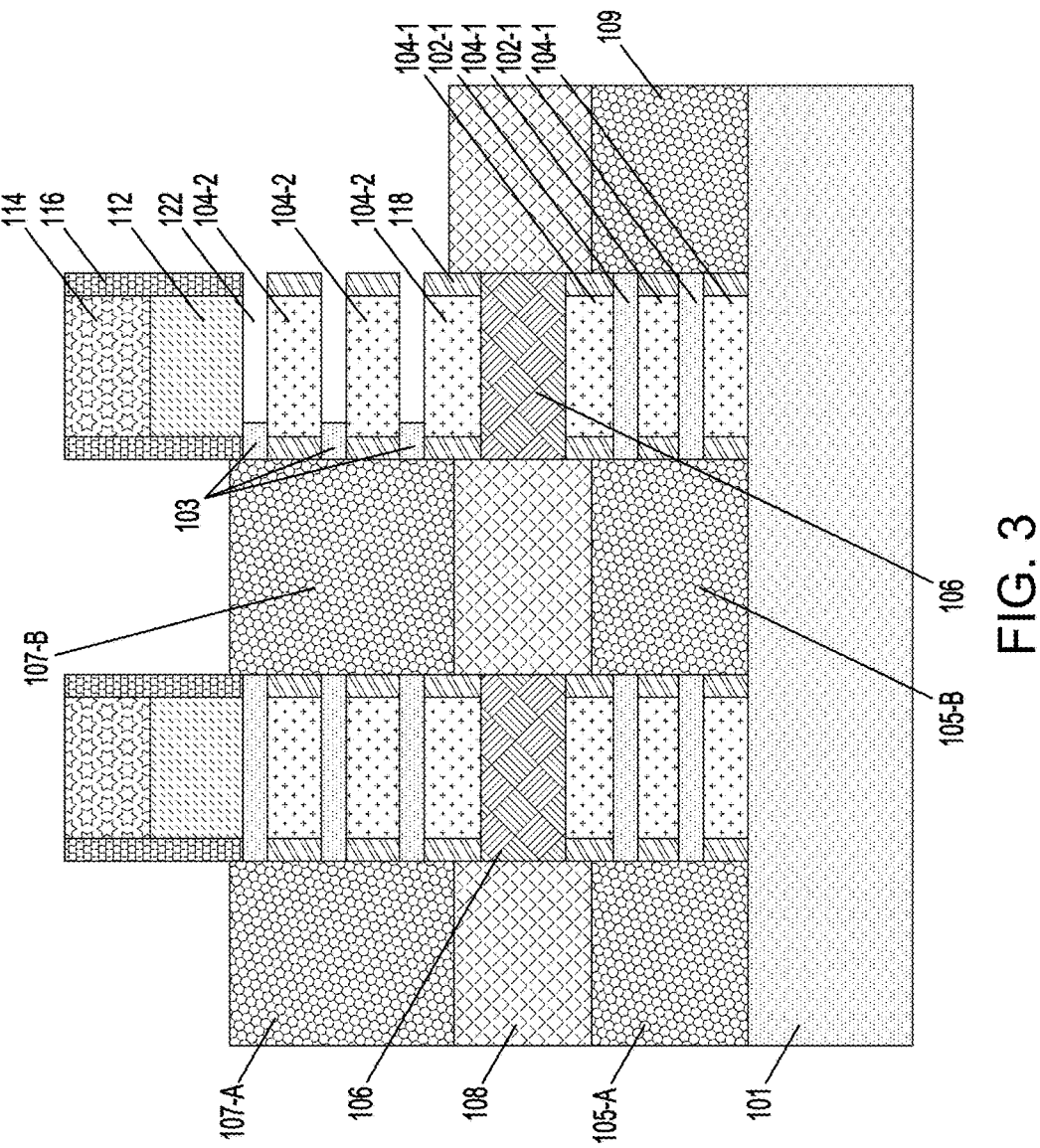
FIG. 3 is a cross-sectional view of the semiconductor structure for use at a third-intermediate fabrication stage, according to an illustrative embodiment.

FIG. 3 illustrates a cross-sectional view of semiconductor structure 100 following a selective lateral recession of nanosheet channel layers 102-2 shown in FIG. 2, e.g., a silicon-selective lateral recession, to form opening 122 and nanosheet channel portion 103. Nanosheet channel layers 102-2 may be selectively etched using wet or dry etch processes to remove a portion of nanosheet channel layers 102-2 without removing sacrificial layers 104-2.

Figure 4:
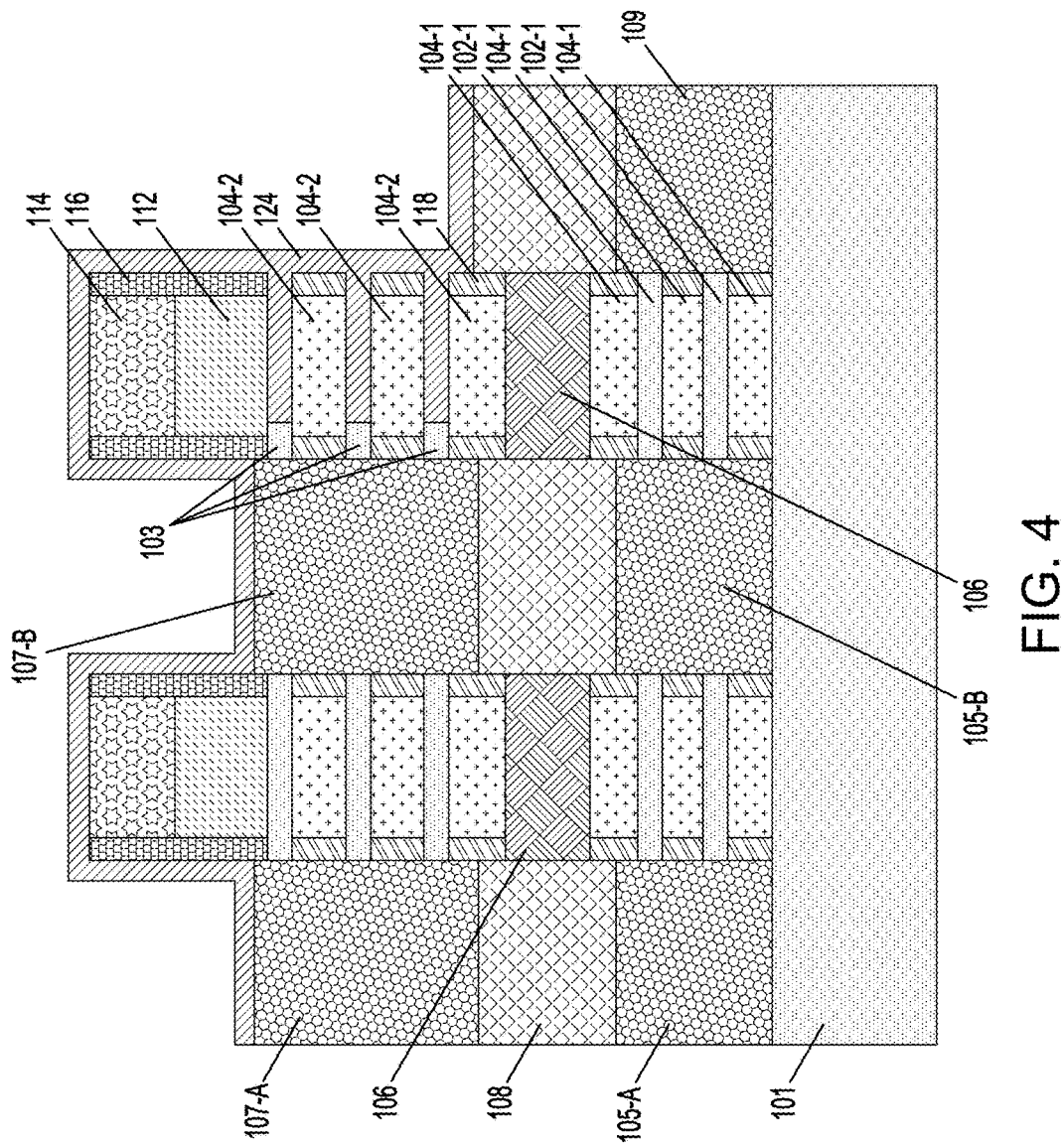
FIG. 4 is a cross-sectional view of the logic device and the electronic fuse region of the semiconductor structure for use at a fourth-intermediate fabrication stage, according to an illustrative embodiment.

FIG. 4 illustrates depositing a dielectric liner 124 in opening 122 formed following the selective lateral recession of nanosheet channel layers 102-2. In addition, dielectric liner 124 is further deposited over the exterior surface of semiconductor structure 100. Suitable material for dielectric liner 124 includes, for example, nitrides such as silicon nitride (SiN) and silicon carbon nitride (SiCN) or other low-k dielectric film. Dielectric liner 124 formed in opening 122 forms a nanosheet channel layer composed of a nanosheet channel portion 103 and a dielectric material portion.

Figure 5:
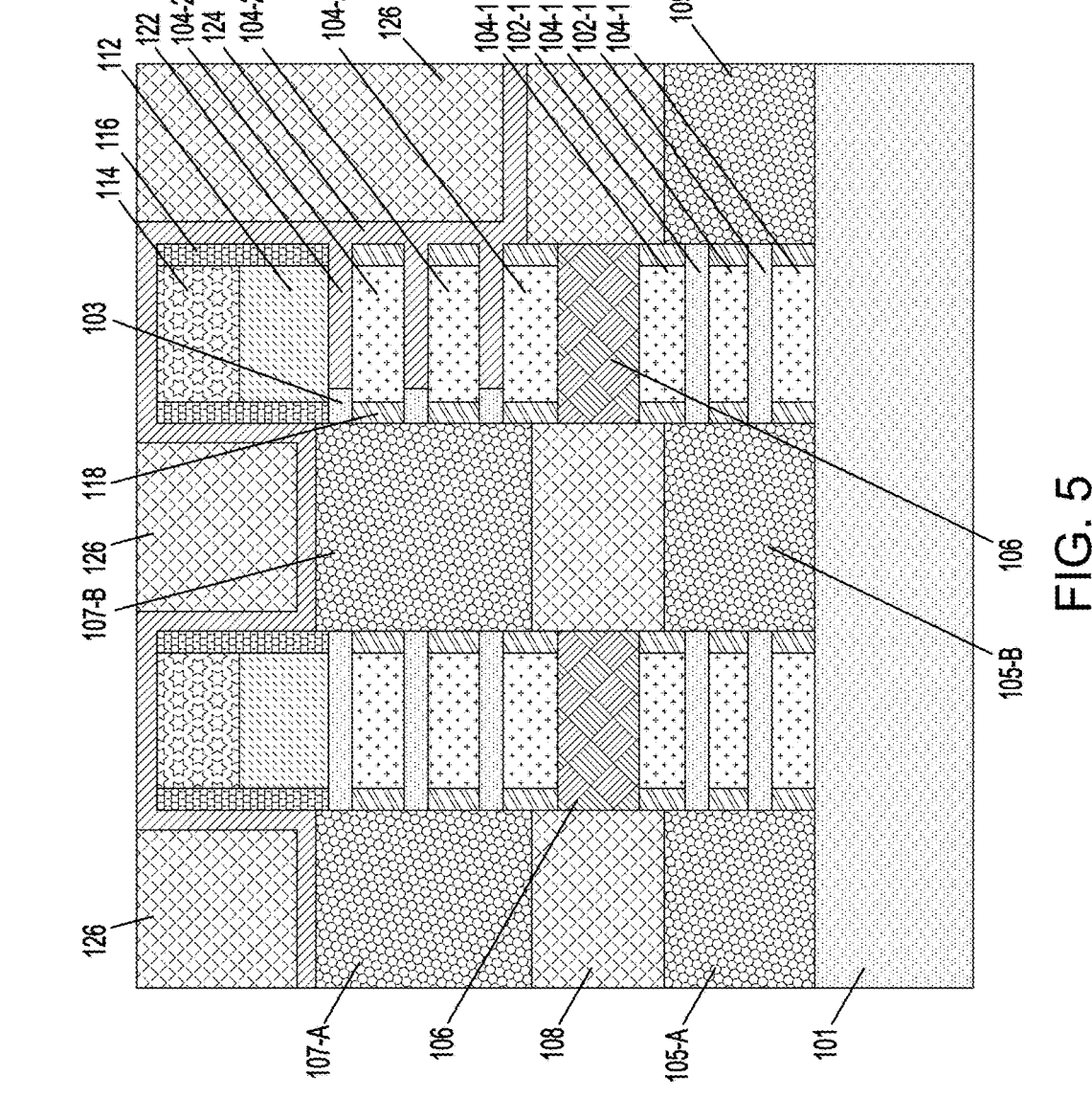
FIG. 5 is a cross-sectional view of the logic device and the electronic fuse region of the semiconductor structure for use at a fifth-intermediate fabrication stage, according to an illustrative embodiment.

FIG. 5 illustrates a cross-sectional view of semiconductor structure 100 following the deposition of dielectric fill 126 on dielectric liner 124. In some embodiments, dielectric fill 126 can be formed by similar processes and of a similar material as ILD layer 108. Alternatively, in some embodiments, dielectric fill 126 may be formed of any suitable isolating material, such as SiO$_2$, SiOC, SiON, etc. Following depositing dielectric fill 126 over dielectric liner 124, a planarization process such as CMP may be carried out.

Figure 6:
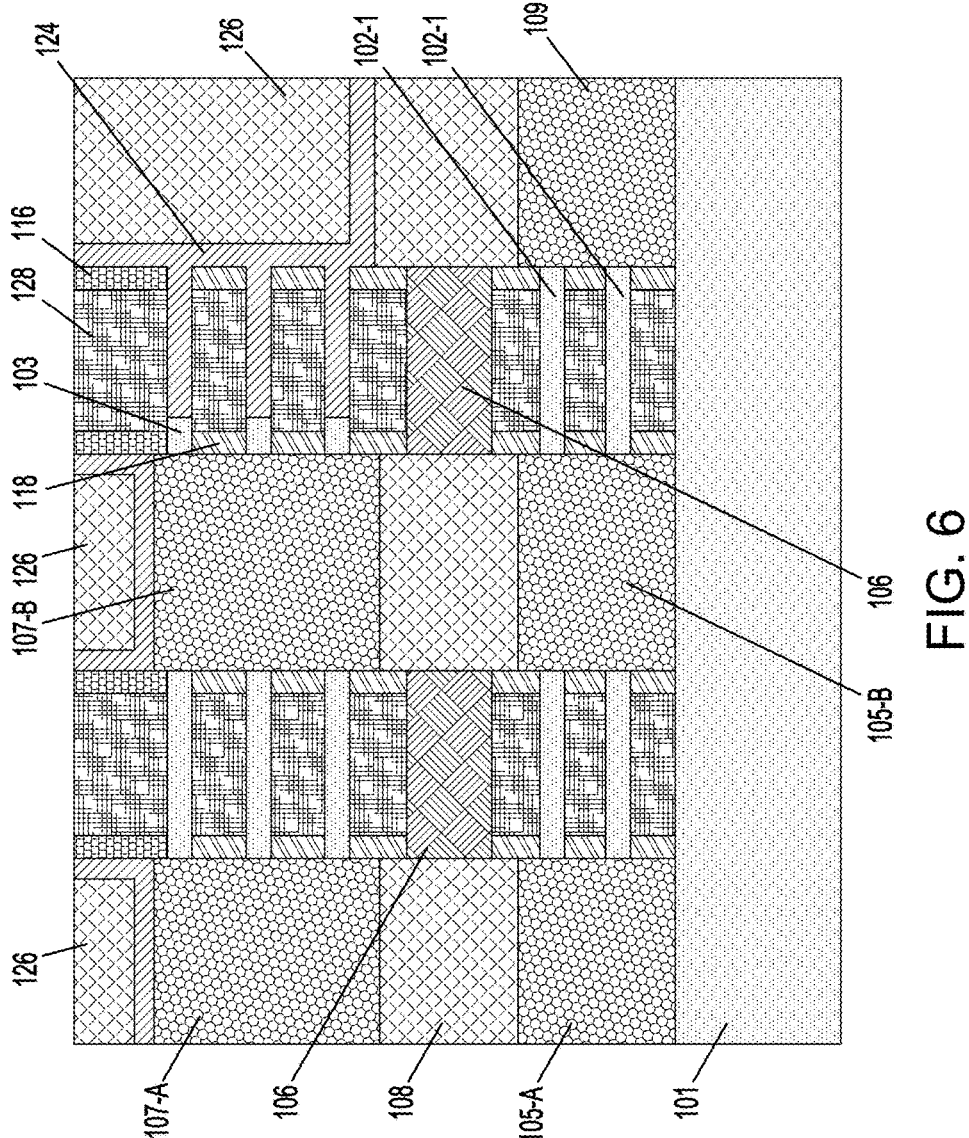
FIG. 6 is a cross-sectional view of the logic device and the electronic fuse region of the semiconductor structure for use at a sixth-intermediate fabrication stage, according to an illustrative embodiment.

FIG. 6 illustrates a cross-sectional view of semiconductor structure 100 following formation of replacement metal gate (RMG) regions 128. During this stage, dummy gate portions 112 and gate HM layers 114 are first removed using a selective etching process such as RIE or wet removal processes. Next, known semiconductor fabrication operations are used to remove sacrificial layers 104-1 selective to nanosheet channel layer 102-1, and sacrificial layers 104-2 selective to nanosheet channel layers 102-2 and dielectric liner 124. In some embodiments, because sacrificial layers 104-1, 104-2 are formed from SiGe, they can be selectively etched with respect to nanosheet channel layers, 102-1, 102-2 formed from Si using, for example, a vapor phase hydrogen chloride (HCL) gas isotropic etch process.

The removed sacrificial layers 104-2, dummy gate portions 112 and gate HM layers 114 are replaced with RMG regions 128 using known replacement high-k metal gate (HKMG) processing operations. In some embodiments, RMG regions 128 include, for example, metal gate and dielectric portions formed in the vacant portions left by removal of sacrificial layers 104-2, dummy gate portions 112 and gate HM layers 114. In illustrative embodiments, each of RMG regions 128 includes a gate dielectric layer such as, for example, a high-K dielectric layer including, but not necessarily limited to, HfO$_2$ (hafnium oxide), ZrO$_2$ (zirconium dioxide), hafnium zirconium oxide, Al$_2$O$_3$ (aluminum oxide), and Ta$_2$O$_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

According to an embodiment, each of RMG regions 128 further includes a metal gate portion including a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The metal gate portions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. It should be appreciated that various other materials may be used for the metal gate portions as desired.

Figure 7:
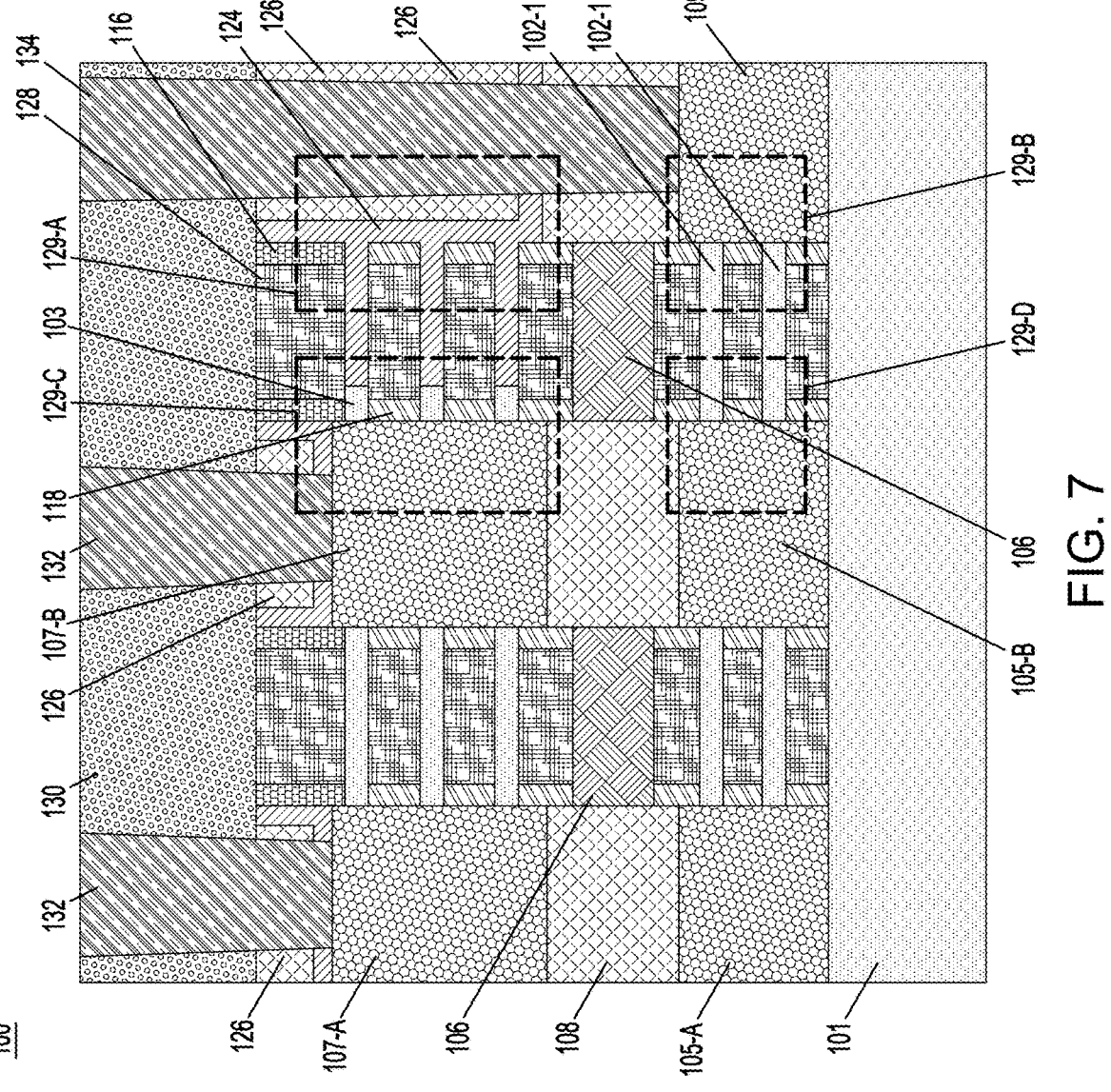
FIG. 7 is a cross-sectional view of the logic device and the electronic fuse region of the semiconductor structure for use at a seventh-intermediate fabrication stage, according to an illustrative embodiment.

FIG. 7 shows formation of top source/drain contacts 132 and a bottom source/drain contact 134. In some embodiments, top source/drain contacts 132 and bottom source/drain contact 134 are formed by first deposing an ILD layer 130 over RMG regions 128 and exposed portions of dielectric fill 126 and dielectric liner 124. ILD layer 130 can be formed by similar processes and material as ILD layer 108.

According to illustrative embodiments, openings corresponding to locations of top source/drain contacts 132 and bottom source/drain contact 134 are formed by standard lithographic and etching processes in ILD layer 130 and through dielectric fill 126 using, for example, a RIE process.

In more detail, portions of dielectric fill 126 exposed via a hardmask (not shown) are etched to expose top surfaces of top source/drain regions 107 and bottom epitaxial region 109 to form source/drain contact openings, which are then filled with a conductive material (e.g., metal) to form top source/drain contacts 132 and bottom source/drain contact 134. In some embodiments, suitable conductive material includes, for example, a conductor such as copper, tungsten, cobalt, ruthenium, etc. The conductive material can be deposited using, for example, a deposition technique such as CVD, PECVD, RFCVD, PVD, ALD, MBD, PLD, LSMCD, sputtering and/or plating. If necessary, a planarization process (e.g., CMP) can be carried out to planarize the top surface of semiconductor structure 100 and remove any excess metal material from on top of semiconductor structure 100.

FIG. 7 further illustrates semiconductor structure 100 having non-active region 129-A, and active regions 129-B, 129-C and 129-D. The non-active region 129-A is formed by way of dielectric liner 124 and dielectric fill 126 formed on one side of the top nanosheet stack. The active region 129-C is formed through the nanosheet channel portion 103 and the top drain region 107-B on the other side of the top nanosheet stack. The active regions 129-B and 129-D are formed through the nanosheet channel layers 102-1 on opposite sides of the bottom nanosheet stack and the respective bottom drain region 105-B and bottom epitaxial region 109.

Figure 8:
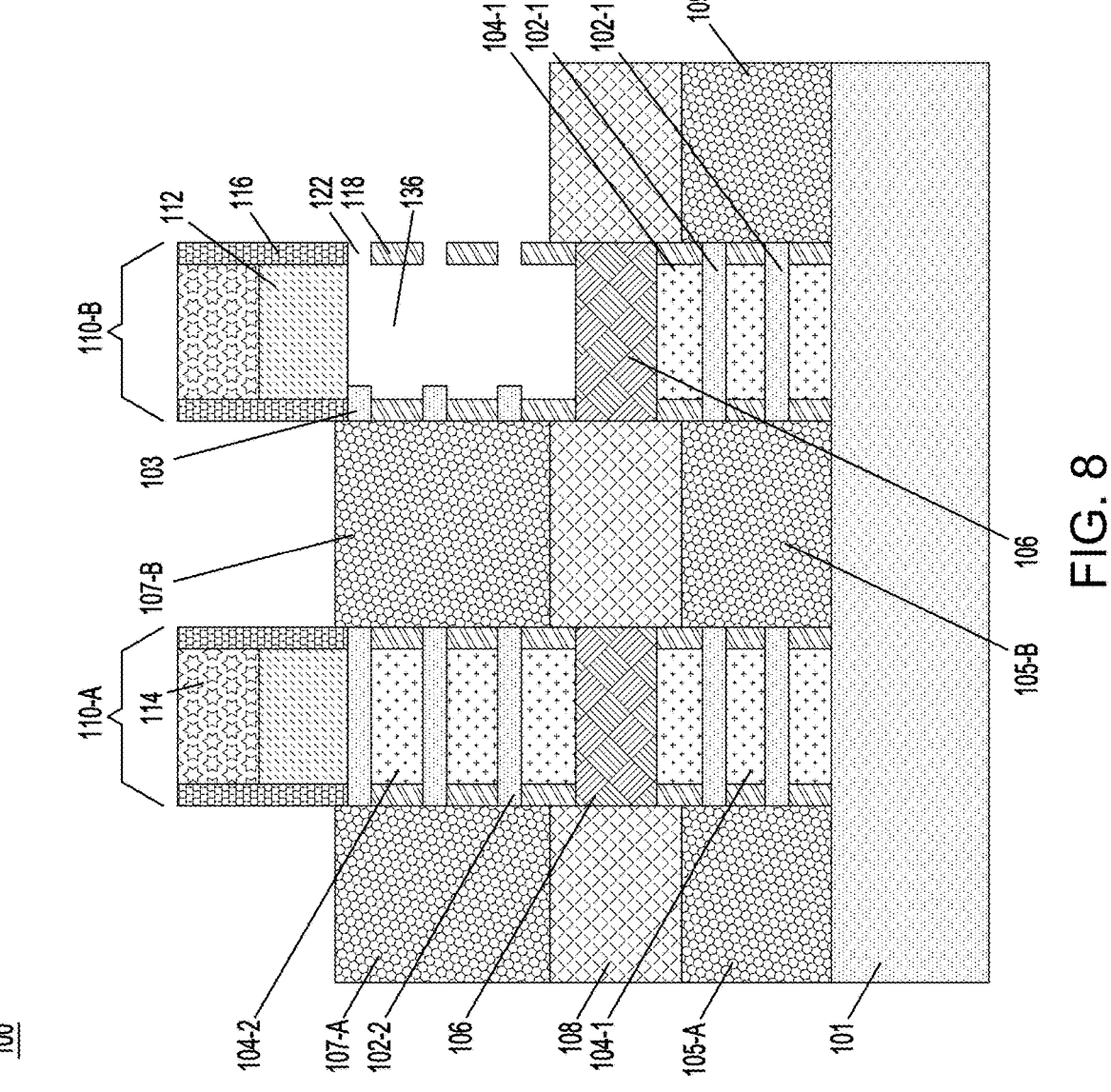
FIG. 8 is a cross-sectional view of a semiconductor structure at a first-intermediate fabrication stage starting from FIG. 3, according to an illustrative alternative embodiment.
Figure 9:
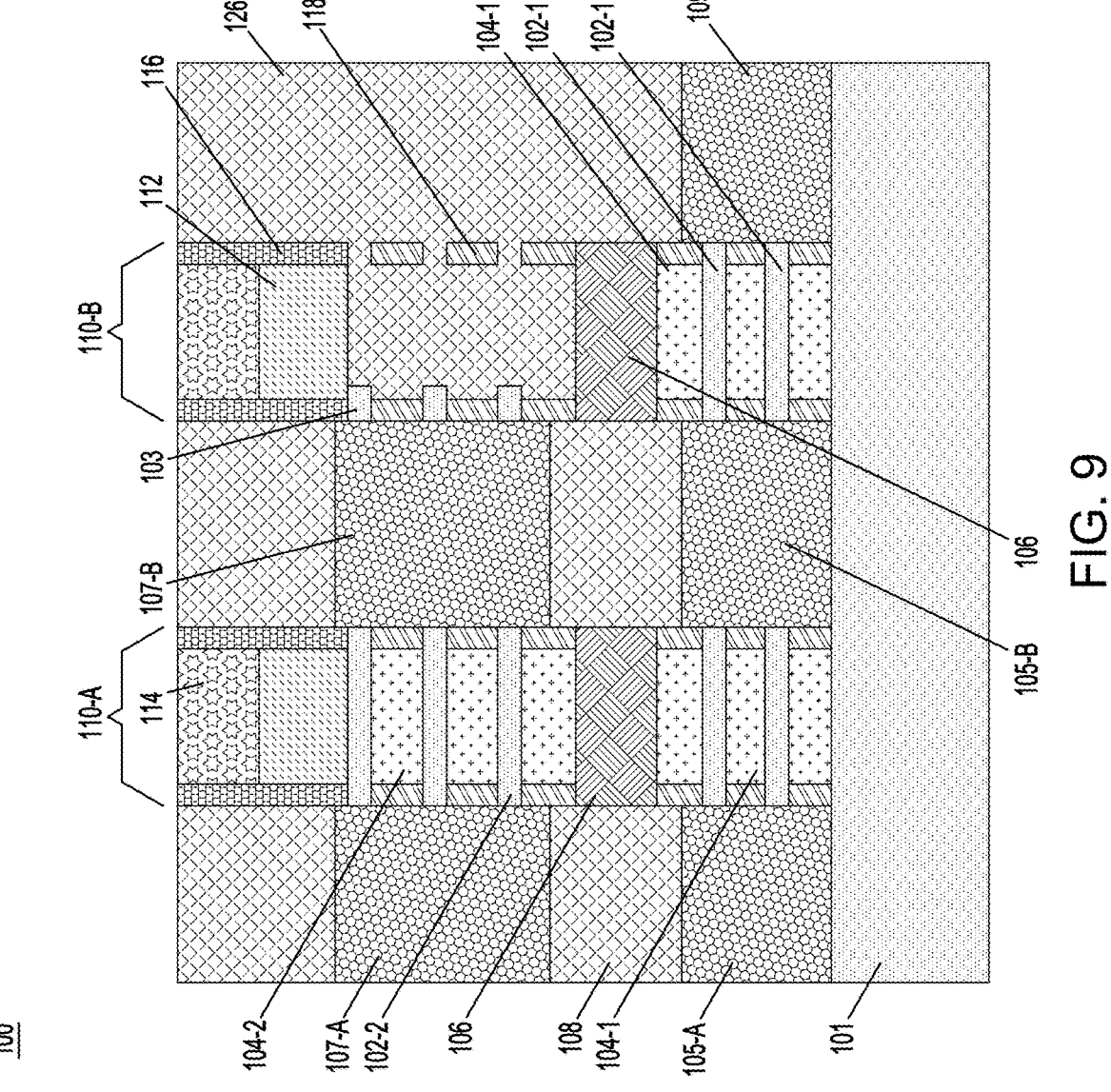
FIG. 9 is a cross-sectional view illustrating the semiconductor structure at a second-intermediate fabrication stage, according to an illustrative embodiment.
Figure 10:
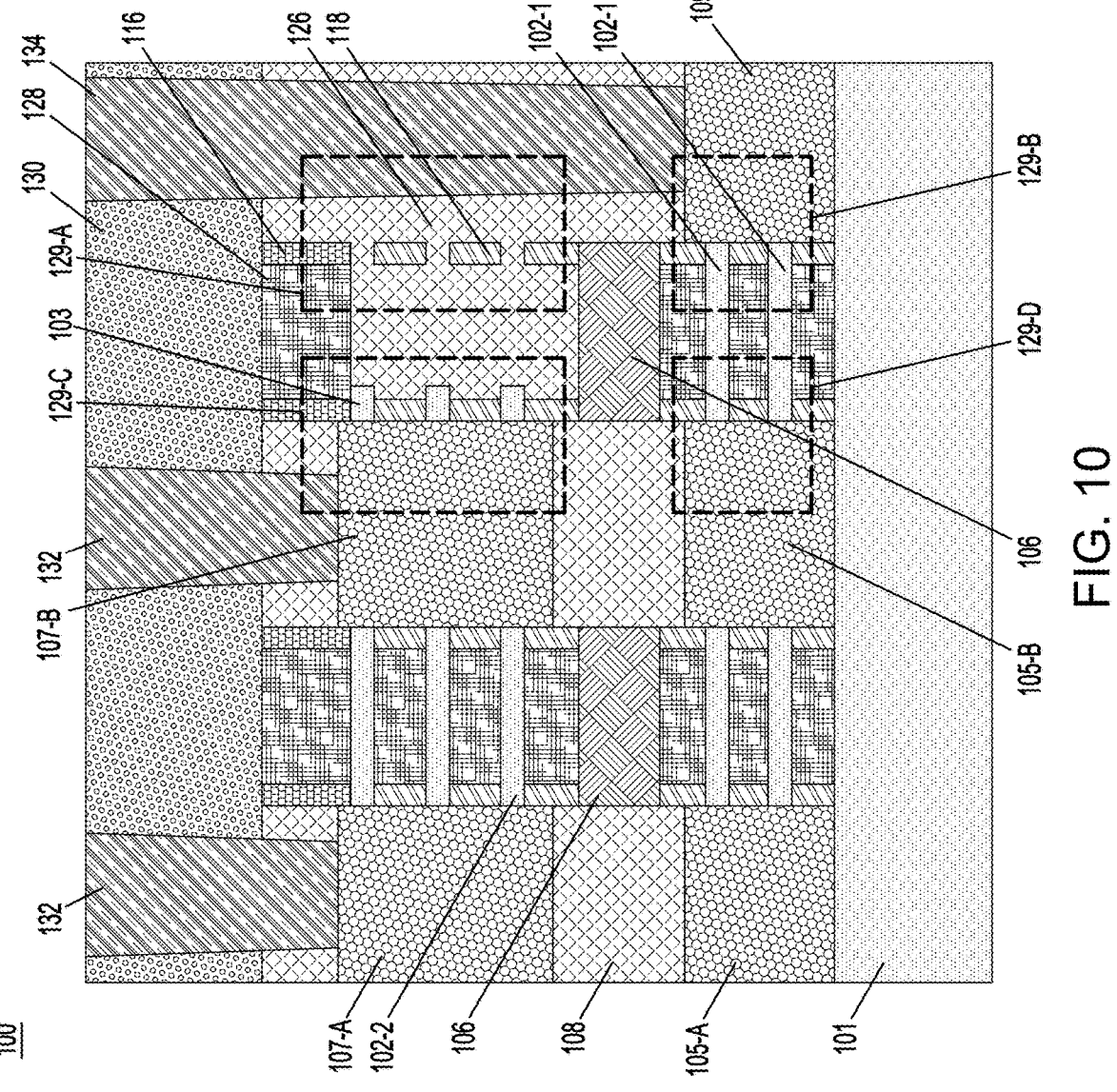
FIG. 10 depicts a cross-sectional view illustrating the semiconductor structure for use at a third-intermediate fabrication stage, according to the illustrative alternative embodiment.

FIGS. 8-10 illustrate an alternative embodiment starting from FIG. 2. Referring to FIG. 8, a selective lateral recession of nanosheet channel layers 102-2 (see FIG. 2) is carried out to form opening 122 and nanosheet channel portion 103, followed by the selective removal of sacrificial layers 104-2 using, for example, a SiGe-selective lateral recession process to form opening 136. Sacrificial layers 104-2 may be selectively etched using wet or dry etch processes to remove sacrificial layers 104-2. For another example, sacrificial layers 104-2 are selectively etched with an etchant that selectively etches SiGe with respect to the surrounding material of the semiconductor structure 100.

FIG. 9 illustrates a cross-sectional view of semiconductor structure 100 following the deposition of dielectric fill 126, which fills openings 122 and 136. In some embodiments, dielectric fill 126 can be formed by similar processes and of a similar material as ILD layer 108. Alternatively, in some embodiments, dielectric fill 126 may be formed of any suitable isolating material, such as $SiO_2$, SiOC, SiON, etc. The deposition of dielectric fill 126 forms a nanosheet channel layer composed of nanosheet channel portion 103 and a dielectric fill portion.

FIG. 10 illustrates a cross-sectional view of semiconductor structure 100 following the formation of RMG regions 128, the formation of top source/drain contacts 132 and a bottom source/drain contact 134, and the deposition of metal layer over the RMG regions 128 and exposed portions of the dielectric fill 126 as discussed above.

FIG. 10 further illustrates semiconductor structure 100 having non-active region 129-A, and active regions 129-B, 129-C and 129-D. The non-active region 129-A is formed by way of dielectric fill 126 formed on one side of the top nanosheet stack. The active region 129-C is formed through the nanosheet channel portion 103 and the top drain region 107-B on the other side of the top nanosheet stack. The active regions 129-B and 129-D are formed through the nanosheet channel layers 102-1 on opposite sides of the bottom nanosheet stack and the respective bottom drain region 105-B and bottom epitaxial region 109.

According to an aspect of the invention, a semiconductor structure comprises a transistor device comprising a first nanosheet device disposed on a second nanosheet device in a stacked configuration, the first nanosheet device comprises a plurality of first nanosheet channel layers, wherein each of the plurality of first nanosheet channel layers comprise a nanosheet channel portion on one end and a dielectric material portion on another end, and the second nanosheet device comprises a plurality of second nanosheet channel layers. The dielectric material portion of the plurality of first nanosheet channel layers is part of a non-active region.

In embodiments, the semiconductor structure further comprises a gate region disposed between the plurality of first nanosheet channel layers and the plurality of second nanosheet channel layers.

In embodiments, the semiconductor structure further comprises a dielectric fill disposed on sidewalls of the first nanosheet device associated with the dielectric material portion.

In embodiments, the first nanosheet device and the second nanosheet device are separated by a middle dielectric insulator layer.

In embodiments, the nanosheet channel portion of the plurality of first nanosheet channel layers and the second nanosheet channel layers each comprise silicon.

In embodiments, the first nanosheet device and the second nanosheet device have opposite polarities.

In embodiments, the first nanosheet device is one of a p-type nanosheet field-effect transistor device or an n-type nanosheet field-effect transistor device and the second nanosheet device is one of a p-type nanosheet field-effect transistor device or an n-type nanosheet field-effect transistor device.

In embodiments, the semiconductor structure further comprises a first source/drain region disposed on a first sidewall of the first nanosheet device associated with the nanosheet channel portion of the plurality of first nanosheet channel layers, and a dielectric fill disposed on a second sidewall of the first nanosheet device associated with the dielectric material portion of the plurality of first nanosheet channel layers.

In embodiments, the semiconductor structure further comprises a second source/drain region disposed on a first sidewall of the plurality of second nanosheet channel layers of the second nanosheet device and a third source/drain region disposed on a second sidewall of the plurality of second nanosheet channel layers of the second nanosheet device.

In embodiments, the first sidewall of the first nanosheet device, the first sidewall of the plurality of second nanosheet channel layers and the second sidewall of the plurality of second nanosheet channel layers are each part of an active region.

According to an aspect of the invention, a semiconductor structure comprises a first transistor device comprising a first nanosheet device disposed on a second nanosheet device in a stacked configuration. The first nanosheet device comprises a plurality of first nanosheet channel layers, wherein each of the plurality of first nanosheet channel layers comprise a first nanosheet channel portion on one end and a first dielectric material portion on another end, and the second nanosheet device comprising a plurality of second nanosheet channel layers. The semiconductor structure further comprises a second transistor device adjacent the first transistor device and comprising a third nanosheet device disposed on a fourth nanosheet device in a stacked configuration. The third nanosheet device comprising a plurality of third nanosheet channel layers, wherein each of the plurality of third nanosheet channel layers comprise a second nanosheet channel portion on one end and a second dielectric material portion on another end, and the fourth nanosheet device comprising a plurality of fourth nanosheet channel layers. The semiconductor structure further comprises a dielectric fill disposed on adjacent sidewalls associated with the first dielectric material portion of the plurality of first nanosheet channel layers and the second dielectric material portion of the plurality of third nanosheet channel layers between the first nanosheet device and the third nanosheet device.

In embodiments, the first transistor device further comprising a first gate region disposed between the plurality of first nanosheet channel layers and the plurality of second nanosheet channel layers, and wherein the second transistor device further comprising a second gate region disposed between the plurality of third nanosheet channel layers and the plurality of fourth nanosheet channel layers.

In embodiments, the semiconductor structure further comprises a first source/drain region disposed on another sidewall of the first nanosheet device associated with the first nanosheet channel portion of the plurality of first nanosheet channel layers, and a second source/drain region disposed on another sidewall of the third nanosheet device associated with the second nanosheet channel portion of the plurality of third nanosheet channel layers.

In embodiments, the semiconductor structure further comprises a third source/drain region disposed on adjacent sidewalls of the plurality of second nanosheet channel layers and the plurality of fourth nanosheet channel layers.

In embodiments, the first nanosheet channel portion, the second nanosheet channel portion, the second nanosheet channel layers and the fourth nanosheet channel layers each comprise silicon.

In embodiments, the first nanosheet device and the fourth nanosheet device have a first polarity, and the second nanosheet device and the fourth nanosheet device have a second polarity different than the first polarity.

In embodiments, the first polarity is an n-type polarity or a p-type polarity and the second polarity is a p-type polarity or an n-type polarity.

According to an aspect of the invention, a semiconductor structure comprises a transistor device comprising a first nanosheet device disposed on a second nanosheet device in a stacked configuration. The first nanosheet device comprises a plurality of first nanosheet channel layers, wherein each of the plurality of first nanosheet channel layers comprise a nanosheet channel portion on one end and a dielectric fill portion on another end. The second nanosheet device comprising a plurality of second nanosheet channel layers. The dielectric fill portion of the plurality of first nanosheet channel layers is part of a non-active region.

In embodiments, the dielectric fill portion is further disposed between the plurality of first nanosheet channel layers and on sidewalls of the first nanosheet device associated with the dielectric fill portion.

In embodiments, the semiconductor structure further comprises a first source/drain region disposed on a sidewall of the first nanosheet device associated with the nanosheet channel portion of the plurality of first nanosheet channel layers, a second source/drain region disposed on a first sidewall of the plurality of second nanosheet channel layers of the second nanosheet device, a third source/drain region disposed on a second sidewall of the plurality of second nanosheet channel layers of the second nanosheet device, and a gate region disposed within the plurality of second nanosheet channel layers of the second nanosheet device.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a transistor device comprising a first nanosheet device disposed on a second nanosheet device in a stacked configuration;
the first nanosheet device comprises a plurality of first nanosheet channel layers, wherein each of the plurality of first nanosheet channel layers comprise a nanosheet channel portion on one end and a dielectric material portion on another end; and
the second nanosheet device comprises a plurality of second nanosheet channel layers;
wherein the dielectric material portion of the plurality of first nanosheet channel layers is part of a non-active region; and
wherein the first nanosheet device and the second nanosheet device have opposite polarities.

2. The semiconductor structure according to claim 1, further comprising a gate region disposed between the plurality of first nanosheet channel layers and the plurality of second nanosheet channel layers.

3. The semiconductor structure according to claim 1, further comprising a dielectric fill disposed on sidewalls of the first nanosheet device associated with the dielectric material portion.

4. The semiconductor structure according to claim 1, wherein the first nanosheet device and the second nanosheet device are separated by a middle dielectric insulator layer.

5. The semiconductor structure according to claim 1, wherein the nanosheet channel portion of the plurality of first nanosheet channel layers and the second nanosheet channel layers each comprise silicon.

6. The semiconductor structure according to claim 1, wherein the first nanosheet device is one of a p-type nanosheet device or an n-type nanosheet device and the second nanosheet device is one of a p-type nanosheet field-effect transistor device or an n-type nanosheet field-effect transistor device.

7. The semiconductor structure according to claim 1, further comprising a first source/drain region disposed on a first sidewall of the first nanosheet device associated with the nanosheet channel portion of the plurality of first nanosheet channel layers, and a dielectric fill disposed on a second sidewall of the first nanosheet device associated with the dielectric material portion of the plurality of first nanosheet channel layers.

8. The semiconductor structure according to claim 7, further comprising a second source/drain region disposed on a first sidewall of the plurality of second nanosheet channel layers of the second nanosheet device and a third source/drain region disposed on a second sidewall of the plurality of second nanosheet channel layers of the second nanosheet device.

9. The semiconductor structure according to claim 8, wherein the first sidewall of the first nanosheet device, the first sidewall of the plurality of second nanosheet channel layers and the second sidewall of the plurality of second nanosheet channel layers are each part of an active region.

10. A semiconductor structure, comprising:
a first transistor device comprising a first nanosheet device disposed on a second nanosheet device in a stacked configuration, the first nanosheet device comprising a plurality of first nanosheet channel layers, wherein each of the plurality of first nanosheet channel layers comprise a first nanosheet channel portion on one end and a first dielectric material portion on another end, and the second nanosheet device comprising a plurality of second nanosheet channel layers, wherein the first nanosheet device and the second nanosheet device have opposite polarities;
a second transistor device adjacent the first transistor device and comprising a third nanosheet device disposed on a fourth nanosheet device in a stacked configuration, the third nanosheet device comprising a plurality of third nanosheet channel layers, wherein each of the plurality of third nanosheet channel layers comprise a second nanosheet channel portion on one end and a second dielectric material portion on another end, and the fourth nanosheet device comprising a plurality of fourth nanosheet channel layers; and
a dielectric fill disposed on adjacent sidewalls associated with the first dielectric material portion of the plurality of first nanosheet channel layers and the second dielectric material portion of the plurality of third nanosheet channel layers between the first nanosheet device and the third nanosheet device.

11. The semiconductor structure according to claim 10, wherein the first transistor device further comprising a first gate region disposed between the plurality of first nanosheet channel layers and the plurality of second nanosheet channel layers, and wherein the second transistor device further comprising a second gate region disposed between the plurality of third nanosheet channel layers and the plurality of fourth nanosheet channel layers.

12. The semiconductor structure according to claim 10, further comprising a first source/drain region disposed on another sidewall of the first nanosheet device associated with the first nanosheet channel portion of the plurality of first nanosheet channel layers, and a second source/drain region disposed on another sidewall of the third nanosheet device associated with the second nanosheet channel portion of the plurality of third nanosheet channel layers.

13. The semiconductor structure according to claim 12, further comprising a third source/drain region disposed on adjacent sidewalls of the plurality of second nanosheet channel layers and the plurality of fourth nanosheet channel layers.

14. The semiconductor structure according to claim 10, wherein the first nanosheet channel portion, the second nanosheet channel portion, the second nanosheet channel layers and the fourth nanosheet channel layers each comprise silicon.

15. The semiconductor structure according to claim 10, wherein the first nanosheet device and the fourth nanosheet device have a first polarity, and the second nanosheet device and the third nanosheet device have a second polarity different than the first polarity.

16. The semiconductor structure according to claim 15, wherein the first polarity is an n-type polarity or a p-type polarity and the second polarity is a p-type polarity or an n-type polarity.

17. A semiconductor structure, comprising:
a transistor device comprising a first nanosheet device disposed on a second nanosheet device in a stacked configuration;
the first nanosheet device comprises a plurality of first nanosheet channel layers, wherein each of the plurality of first nanosheet channel layers comprise a nanosheet channel portion on one end and a dielectric fill portion on another end; and
the second nanosheet device comprising a plurality of second nanosheet channel layers;
wherein the dielectric fill portion of the plurality of first nanosheet channel layers is part of a non-active region;

a first source/drain region disposed on a sidewall of the first nanosheet device associated with the nanosheet channel portion of the plurality of first nanosheet channel layers; and a second source/drain region disposed on a first sidewall of the plurality of second nanosheet channel layers of the second nanosheet device.

18. The semiconductor structure according to claim 17, wherein the dielectric fill portion is further disposed between the plurality of first nanosheet channel layers and on sidewalls of the first nanosheet device associated with the dielectric fill portion.

19. The semiconductor structure according to claim 18, further comprising:

a third source/drain region disposed on a second sidewall of the plurality of second nanosheet channel layers of the second nanosheet device; and a gate region disposed within the plurality of second nanosheet channel layers of the second nanosheet device.

20. The semiconductor structure according to claim 17, wherein the first nanosheet device and the second nanosheet device have opposite polarities.

* * * * *